United States Patent
Wang (10) Patent No.: US 10,401,731 B2
(45) Date of Patent: Sep. 3, 2019

(54) POST-BAKING DEVICE AND POST-BAKING METHOD FOR FORMING BLACK MATRIX

(71) Applicant: BOE Technology Group Co., Ltd., Beijing (CN)

(72) Inventor: Lu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 317 days.

(21) Appl. No.: 15/128,291

(22) PCT Filed: Nov. 2, 2015

(86) PCT No.: PCT/CN2015/093600
§ 371 (c)(1),
(2) Date: Sep. 22, 2016

(87) PCT Pub. No.: WO2016/197528
PCT Pub. Date: Dec. 15, 2016

(65) Prior Publication Data
US 2018/0173098 A1    Jun. 21, 2018

(30) Foreign Application Priority Data

Jun. 10, 2015   (CN) .......................... 2015 1 0315992

(51) Int. Cl.
*G03F 7/40*    (2006.01)
*H01L 21/67*   (2006.01)
(Continued)

(52) U.S. Cl.
CPC ............... *G03F 7/40* (2013.01); *G03F 7/004* (2013.01); *G03F 7/0007* (2013.01);
(Continued)

(58) Field of Classification Search
CPC ........ G03F 7/401; G03F 7/0007; G03F 7/004; H01L 21/563; H01L 21/67;
(Continued)

(56) References Cited

U.S. PATENT DOCUMENTS

| | | | |
|---|---|---|---|
| 6,682,862 B1 * | 1/2004 | Chang .................... | G02B 5/201 430/200 |
| 9,147,584 B2 * | 9/2015 | Lu ............................ | H01L 21/56 |
| 2008/0153049 A1 | 6/2008 | Nitadori et al. | |

FOREIGN PATENT DOCUMENTS

| CN | 103117233 A | 5/2013 |
|---|---|---|
| CN | 103278945 A | 9/2013 |

(Continued)

OTHER PUBLICATIONS

Mar. 8, 2016—WO—International Search Report and Written Opinion Appn PCT/CN2015/093600 with English Tran.

*Primary Examiner* — Shawntina T Fuqua
(74) *Attorney, Agent, or Firm* — Banner & Witcoff, Ltd.

(57) ABSTRACT

A post-baking device and post-baking method for forming a black matrix are disclosed, and the post-baking device includes a housing defining an inner accommodation space therein, a plurality of heating elements provided within the housing, and at least one bracket provided in the inner accommodation space. The at least one bracket is configured to bear the substrate formed with the black matrix, and the bracket is rotatable with respect to the plurality of heating elements.

18 Claims, 3 Drawing Sheets

(51) Int. Cl.
　　　　*G03F 7/004*　　　　(2006.01)
　　　　*H01L 21/56*　　　　(2006.01)
　　　　*H01L 21/687*　　　(2006.01)
　　　　*G03F 7/00*　　　　　(2006.01)

(52) U.S. Cl.
　　　　CPC ............ *H01L 21/563* (2013.01); *H01L 21/67* (2013.01); *H01L 21/67109* (2013.01); *H01L 21/67253* (2013.01); *H01L 21/67288* (2013.01); *H01L 21/68764* (2013.01); *H01L 21/68771* (2013.01); *H01L 21/68778* (2013.01); *H01L 21/68785* (2013.01)

(58) Field of Classification Search
　　　　CPC ......... H01L 21/67109; H01L 21/67253; H01L 21/67288; H01L 21/68764; H01L 21/68771; H01L 21/68778; H01L 21/68785; G02B 5/201; G02F 1/133516
　　　　See application file for complete search history.

(56) References Cited

FOREIGN PATENT DOCUMENTS

| CN | 104849969 A | 8/2015 |
|---|---|---|
| JP | 2002134383 A | 5/2002 |
| JP | 04343216 B2 | 10/2009 |

\* cited by examiner

POST-BAKING DEVICE AND POST-BAKING METHOD FOR FORMING BLACK MATRIX

The application is a U.S. National Phase Entry of International Application No. PCT/CN2015/093600 filed on Nov. 2, 2015, designating the United States of America and claiming priority to Chinese Patent Application No. 201510315992.1 filed on Jun. 10, 2015. The present application claims priority to and the benefit of the above-identified applications and the above-identified applications are incorporated by reference herein in their entirety.

TECHNICAL FIELD

Embodiments of the present disclosure relate to a post-baking device and post-baking method for forming a black matrix.

BACKGROUND

The black matrix (BM) on the substrate of a display panel generally needs to be placed into a stationary post-baking device to be baked for curing after the completion of a development process; in this process, the black matrix on the substrate may undergo variation in shape at the edge locations under the influence of gravity, and then the forming accuracy of the black matrix on the substrate is impacted.

For example, for the black matrix on a color filter substrate, the black matrix and red, green and blue color filters are coated onto the glass base substrate and are formed through exposure and development processes, and then they are brought into a post-baking device for baking and curing (for short, post-baking). In the post-baking process of the substrate, because the material forming the black matrix is under the influence of gravity, the black matrix may undergo a shape collapse phenomenon at its edges. The collapse in shape of the black matrix cause negative influence upon the substrate quality.

SUMMARY

Embodiments of the present disclosure provide a post-baking device and a post-baking method for forming a black matrix; in the post-baking period, the substrate formed with the black matrix and the heating elements rotate with respect to each other; further, the rotating speed of the substrate formed with the black matrix can be varied by monitoring the extent of deformation of the black matrix, thus the black matrix of a favorable profile can be obtained.

In one aspect, an embodiment of the present disclosure provides a post-baking device configured for forming a black matrix, comprising: a housing defining an inner accommodation space; a plurality of heating elements provided within the housing; and at least one bracket provided in the inner accommodation space and configured to bear a substrate formed with the black matrix; the bracket is rotatable with respect to the plurality of heating elements.

In another aspect, an embodiment of the present disclosure provides a post-baking method for forming a black matrix, comprising: providing a housing which defines an inner accommodation space and in which a plurality of heating elements are provided; placing the substrate comprising the black matrix to be post-baked onto at least one bracket and into the inner accommodation space; and post-baking the black matrix by the heating elements during a post-baking period, and at the same time, rotating the at least one bracket with respect to the heating elements.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
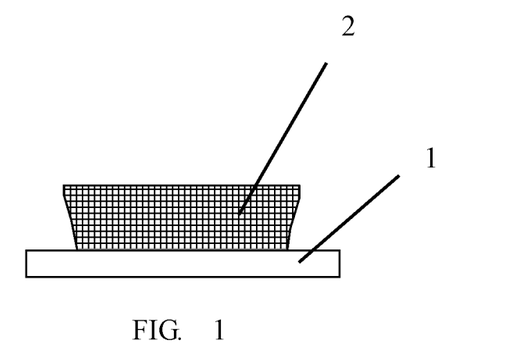
FIG. 1 illustrates a sectional view of a black matrix on a substrate after its development process.

FIG. 1 is a schematic view illustrating the shape of the black matrix on a substrate after its development process.

As illustrated in FIG. 1, the substrate to be processed comprises a base substrate 1 such as a glass base substrate 1, and a black matrix 2 provided on one surface of the base substrate 1 (i.e., the upper surface in FIG. 1). The black matrix 2 is firstly applied onto the glass base substrate 1, and then an undercut shape illustrated in FIG. 1 is formed after the exposure and development process.

Figure 2:
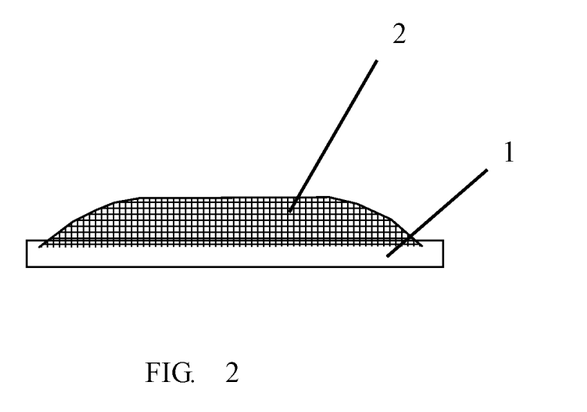
FIG. 2 illustrates a sectional view of a black matrix on a substrate after its post-baking process in a standstill state.

FIG. 2 is a schematic view illustrating the shape of the black matrix on the substrate after its post-baking process in a standstill state, that is to say, in the post-baking period, the substrate formed with the black matrix is stationary with respect to the heat source.

As illustrated in FIG. 2, during the process of baking the substrate, which is placed horizontally in a post-baking device, in a standstill state, the black matrix 2 may undergo deformation under the influence of gravity and other factors such as heating. As compared with the black matrix 2 before its post-baking process as illustrated in FIG. 1, the black matrix 2 after the post-baking as illustrated in FIG. 2 has a shape that is approximately like a trapezoid, which is small at the top and big at the bottom. Apparently, this will increase the coverage of the black matrix 2 on the glass base substrate 1, and therefore, adverse effect on the light transmittance of the substrate is caused.

For the sake of convenience in description, hereinafter, the effect that the black matrix 2 undergoes deformation in a post-baking process under the influence of gravity and other factors such as heating is called "collapse effect".

Figure 3:
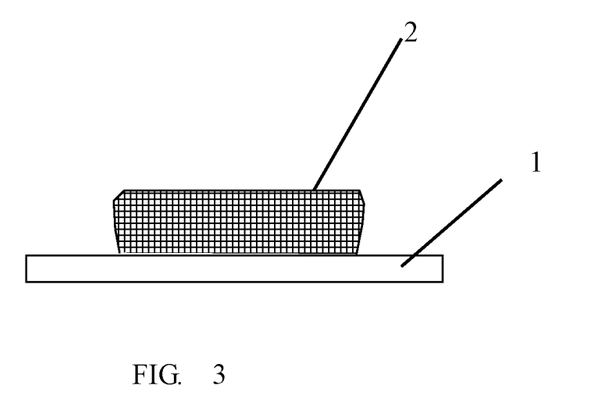
FIG. 3 illustrates a sectional view of an ideal cross sectional shape of a black matrix on a substrate after its post-baking process.

FIG. 3 is a sectional view illustrating an ideal shape of the black matrix on the substrate after its post-baking process.

As illustrated in FIG. 3, the ideal shape of the black matrix on the substrate after its post-baking is a shape, which substantially maintains an inverted trapezoid shape after its exposure and development process as illustrated in FIG. 1, or a shape closer to a rectangle as illustrated in FIG. 3.

To achieve the above ideal black matrix on the substrate, in the following, a detailed introduction of the post-baking device, which is configured for forming a black matrix on a substrate, according to an embodiment of the present disclosure will be given.

Figure 4:
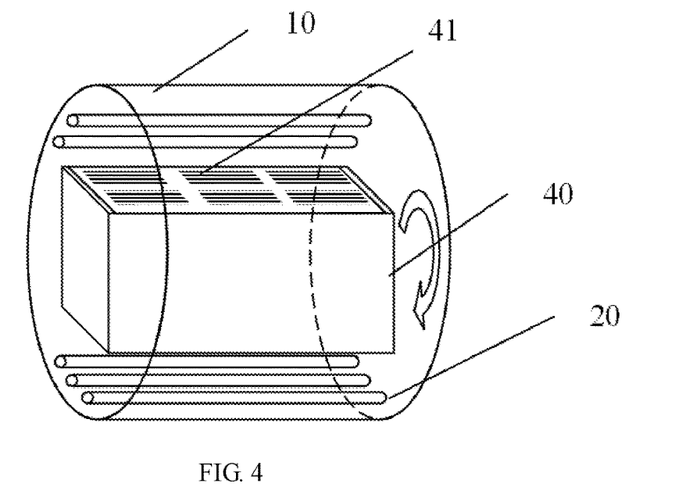
FIG. 4 illustrates a structural schematic view of a post-baking device for forming a black matrix according to an embodiment of the present disclosure.

FIG. 4 is a structural schematic view illustrating the post-baking device for forming a black matrix on a substrate according to an embodiment of the present disclosure.

As illustrated in FIG. 4, according to one aspect of the present disclosure, a post-baking device for forming a black matrix on the substrate is provided, and comprises a housing 10 defining an inner accommodation space therein, a plurality of heating elements 20 provided within the housing, and at least one bracket 40 provided in the inner accommodation space, and the at least one bracket is configured to bear a substrate 41 formed with a black matrix, and the at least one bracket 40 is rotatable with respect to the plurality of heating elements 20.

The substrate 41 is for example a color filter substrate or an array substrate, on which the black matrix is to be formed.

Although a cylindrical housing 10 is illustrated in FIG. 4, the housing 10 may be a column having a polygonal cross section or a regular polygonal cross section without departing from the scope of the embodiment of the present disclosure. In addition, it's apparent for those skilled in the related art that the internal temperature of the post-baking device in operating is high, and in order to reduce heat loss, the outside of the housing 10 may be covered by an heat insulating layer or may be coated with a heat insulating material. The housing 10 may comprise a metal material, such as stainless steel. Although not specifically illustrated in the drawings, but as known to those skilled in the related art, the central sites at both ends of the housing 10 may be provided with mounting seats for supporting the bracket 40 therein.

The plurality of heating elements 20 can be provided on the inner wall of the housing 10, for example, evenly or non-evenly. The heating elements 20 may each comprise for example any one of a resistance heater, an infrared heater, a dielectric heater or any combination thereof, the heating element 20 may take a form of any one of a heating wire, a heating rod or a heating sheet or any combination thereof, and correspondingly, the shape of the heating element 20 may be any one of a planar, a strip, a rod or any combination thereof, but the embodiment of the present disclosure is not limited thereto, the shape of the heating element 20 can be any type of the heating element apparent to those skilled in the art. For example, if the heating element is rod-shaped and has a length identical to the height of the housing, the heating element can be provided on the inner wall of the housing with its axis parallel with the central axis of the housing.

As an example, the heating element 20 may also be provided at the end face of the housing, the center of the housing and the like, the embodiment of the present disclosure has no restriction in this regard, and the position of the heating element 20 can be selected by those skilled in the art according to practical requirements.

As an example, in the embodiment of the present disclosure, the housing 10 or the bracket can be rotated, or both of the housing 10 and the bracket can be rotated.

Optionally, for a rotatable bracket, its rotating speed may also be variable.

As an example, the post-baking device according to the embodiment of the present disclosure may further comprise a driving device configured to rotate the bracket. For example, the driving device can be an electrical motor, or other available power source, of course. Based on the range of the rotating speed of the bracket 40 of the post-baking device, the electrical motor can be a speed variable motor having a corresponding rotating speed. Additionally, although not being illustrated in the figures, a gearbox may be provided between the bracket and the electrical motor, so that a predetermined gear ratio is available for matching the rotating speeds of the bracket and the electrical motor. On the basis of experiments, the rotating speed of the bracket is determined according to the centrifugal force required for forming various types of substrates, and then the rotating speed of the speed variable motor can be selected according to the rotating speed of the bracket.

The bracket 40 in FIG. 4 is illustrated to be a column with a polygonal cross section and the center of the column coincides with the center of the housing, the substrate 41 is provided at a side of the column, or each side of the column is provided with one substrate 41; the center of the column may also not coincide with the center of the housing but shift toward a side. For example, the cross section of the bracket 40 may be a regular triangle, a regular quadrilateral, a regular pentagon or a regular hexagon. A designer may determine the appropriate number of substrates processed by the post-baking device each time according to the diameter or circumferential dimension of the housing 10 and the dimension of the substrate to be post-baked, and then determine whether the cross section of the bracket 40 is a regular triangle, a regular quadrilateral, a regular pentagon or a regular hexagon.

As an example, the bracket 40 can also be planar, the centre of which is parallel with the center of the housing, and its centre may also coincide with the center of the housing or shift from the center of the housing by a distance.

As an example, the number of the brackets 40 may be two or more, so that a plurality of substrates can be post-baked at the same time, each of the brackets may be shaped as a plate, the plurality of brackets can be provided parallel with each other, or may be provided jointed with each other so as to constitute a prism, each bracket constitutes one side of which.

As an example, if the housing 10 is rotated, the two ends of the bracket 40 can be secured to the inner wall or the end faces of the housing by means of fasteners, and the embodiment of the present disclosure has no restriction in this regard. However, for a rotatable bracket, the manner for securing the bracket should not interfere with its rotation, for example, the bracket may be provided with a rotating shaft, with which the bracket is driven to rotate.

As an example, the rotating shaft can be secured together with the bracket and configured to be driven by a driving device. For example, when a plurality of brackets are provided, each of the brackets can be equipped with one rotating shaft, or the plurality of brackets share one rotating shaft; when a plurality of rotating shafts are provided, the driving device can drive the plurality of rotating shafts synchronously.

Optionally, the bracket 40 can be provided with a fixture (not illustrated) thereon so as to arrange the substrate 41 detachably onto the bracket 40.

In one embodiment of the present disclosure, the post-baking device may further comprise a detection device configured to detect the light intensity of the light transmitting through a region of the substrate in which the black matrix is formed, determine whether the black matrix undergoes deformation, and output a driving signal to the driving device.

Figure 5:
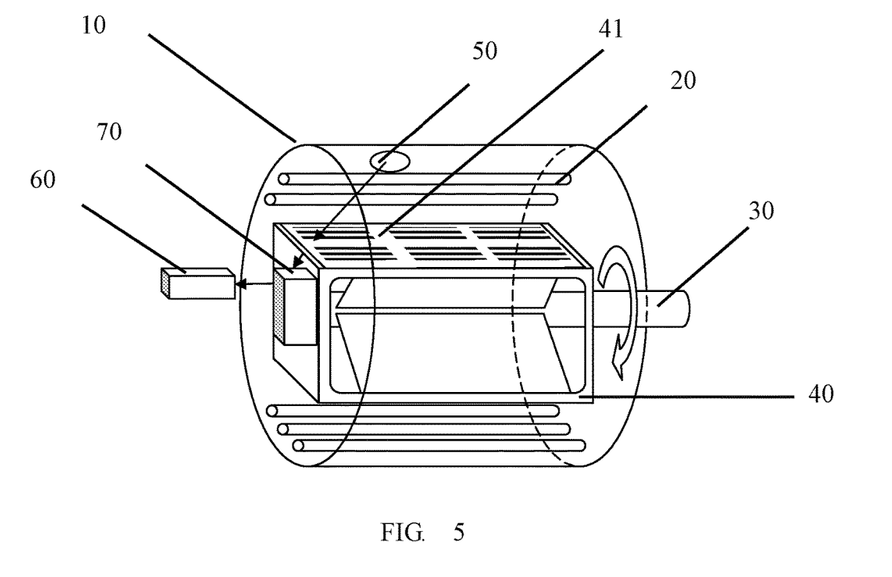
FIG. 5 illustrates another structural schematic view of a post-baking device for forming a black matrix according to an embodiment of the present disclosure.

As an example, the detection device may comprise a light source 50 emitting light toward the region of the substrate in which the black matrix is formed, and a photometer 60 configured to receive the light emitted from the light source and transmitting through the region and detect the light intensity of the light transmitting through the region, for example, as illustrated in FIG. 5.

Further, the detection device may further comprise a processing unit configured to compare the light intensity detected by the photometer 60 with a preset light intensity so as to determine whether the black matrix undergoes deformation and to output the driving signal. The detection device may further comprise a storage unit for storing the preset light intensity. The processing unit may be implemented for example by a specific purpose or general purpose computing apparatus, for example, a CUP (central processing unit) or DSP (digital signal processing), etc. The storage unit is for example any kinds of available memories, for example, a nonvolatile storage or a volatile memory, specifically, a flash for example.

It should be noted here that the preset light intensity may be the light intensity in the case the black matrix does not undergo deformation, that is, when the black matrix has its cross sectional shape after the development process and before the post-baking process or when the black matrix has its cross sectional shape in an ideal state (for example, the designed value).

In another example, the detection device may comprise a light source emitting light toward the region of the substrate, in which region a black matrix is formed, and a photoelectric sensor configured to receive the light emitted from the light source and transmitting through the region, detect the light intensity of the light transmitting through the region, determine whether the black matrix undergoes deformation and output a driving signal; here the above photoelectric sensor can be integrated with a storage module and a processing module therein for conducting the above operations.

The driving signal is provided to the driving device so that the driving device can drive the bracket to rotate, or to rotate the bracket at different rotating speeds according to the deformation degree of the black matrix.

For example, as illustrated in FIG. 5, the light source 50 can emit light of a predetermined wavelength and provided on the inner wall of the housing 10. The side wall, which is near the light source 50, of the housing 10 can be provided with a manhole and/or a transparent viewing window. A light source 50 emits light toward the region of the substrate 41 in which the black matrix is formed. The light transmitted through the gap in the black matrix on the substrate 41 is received by the photometer 60 or the photoelectric sensor arranged on the optical path downstream of the substrate 41. Then the photometer 60 or the photoelectric sensor of the detection device can detect the light intensity of the received light, thus the detection device can determine the deformation degree of the black matrix and then transmit a driving signal corresponding thereto. The driving device can drive the bracket 40 to rotate correspondingly after receiving the driving signal.

It should be noted here that the light source 50 can be a surface light source, or a point light source of a certain radiating area, thereby capable of ensuring that a certain area of the substrate 41 formed with the black matrixes is irradiated, instead of irradiation at a single point.

Figure 6:
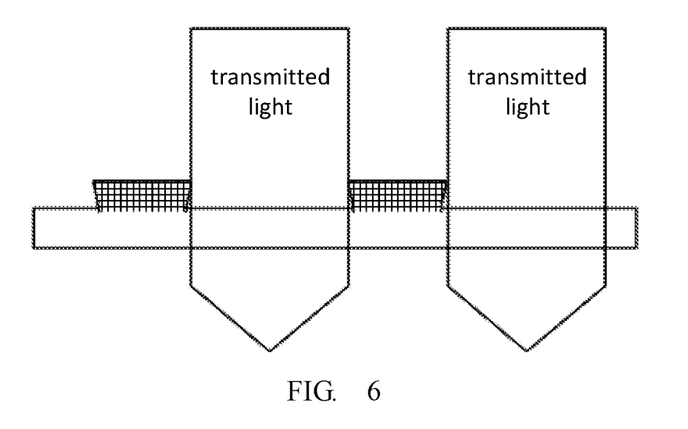
FIG. 6 illustrates a schematic diagram of the light transmittance of a substrate after its development process and before its post-baking process.
Figure 7:
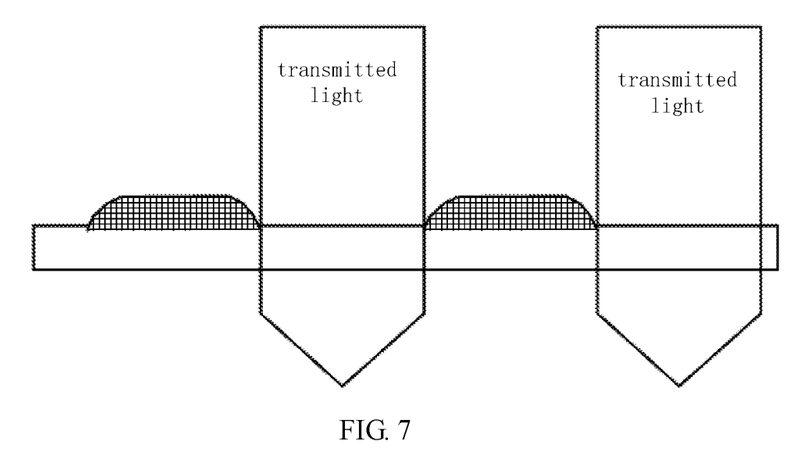
FIG. 7 is a schematic diagram illustrating the variation of the light transmittance during the post-baking process of the substrate.

FIG. 6 is a schematic view illustrating the light transmittance of the substrate after its development process and before its post-baking process, and FIG. 7 is a schematic view illustrating the variation of the light transmittance of the substrate in the post-baking process.

Referring to FIG. 6 now, before the post-baking process, the spacing or gap in the black matrix may be different for different substrates 41, and the light transmittance thereof is also different. However, for each type of the substrates 41, when the black matrix undergoes no deformation, that is to say, the black matrix has its cross sectional shape after the development process and before the post-baking process, or the black matrix has its cross sectional shape in an ideal state (for example, the designed value), the light transmittance of the black matrix region can be obtained in advance, for example, obtained through measurement or simulation beforehand, thus the obtained corresponding light intensity can be taken as the preset light intensity which can be stored in a separate storage unit or in the photoelectric sensor.

Referring to FIG. 7 now, in the post-baking process, the deformation of the black matrix on the substrate 41 and collapse effect may occur under the influence of gravity and other factors such as heating. Therefore, the spacing in the black matrix may be decreased, and the light transmittance is decreased accordingly. Therefore, the light intensity detected by the photometer 60 or the photoelectric sensor is decreased, and based on the comparison between the magnitude of the detected light intensity and the magnitude of the preset light intensity stored in advance, the detection device can determine the magnitude of the spacing between the black matrixes on the substrate 41 so as to determine the extent of deformation of the black matrix, thereby generating a corresponding driving signal with which the driving device controls the bracket, for example, the rotating speed of the rotating shaft. For example, in the case of the detected light intensity being less than the preset light intensity, it means that the spacing in the black matrix become narrower, that is to say, the collapse effect occurs, then the driving device drives the bracket 40 to rotate at an increased rotating speed, based on the driving signal. Due to the growth of the rotating speed, the black matrix of the substrate 41 provided on the bracket 40 is subjected to an increased centrifugal force, thus it is possible to prevent the black matrix from further deforming. In the case of the detected light intensity is more than the preset light intensity, a reversed operations can be adopted, and the driving device drives the bracket 40 to rotate at a decreased rotating speed. As a result, it is possible to effectively improve the forming quality of the black matrix on the substrate 41 in the post-baking process.

Additionally, the photometer 60 or the photoelectric sensor can be provided at one of the two end faces of the housing 10.

According to the embodiment of the present disclosure, the post-baking device may further comprise an optical system 70 provided between the substrate 41 and the photometer 60 or the photoelectric sensor, and the optical system 70 is configured to guide the light, which is emitted from the light source and transmits through the region of the substrate 41 formed with a black matrix, toward the photometer or the photoelectric sensor.

The optical system 70 may comprise a reflector, such as a plane mirror or a concave mirror. In such cases, the reflector may be provided at one of the two end faces of the housing 10 and within the optical path of the light emitted from the light source and transmitting through the region of the substrate formed with the black matrix, the reflector reflects the light to the photometer 60 or the photoelectric sensor. The optical system 70 may further comprise a convex lens. The convex lens is provided within the optical path of the light emitted from the light source and transmitting through the region of the substrate formed with the black matrix; the convex lens can focus the light onto the photometer 60 or the photoelectric sensor, reduce the scattering of the light, and correspondingly improve the detection accuracy. The optical system 70 may further comprise a combination of the convex lens and the plane mirror. In such a case, the convex lens can focus the light, which is emitted from the light source and transmits through the region of the substrate formed with the black matrix, onto the plane mirror, and then the plane mirror reflects the light onto the photometer 60 or the photoelectric sensor. The optical system 70 may also further comprise a combination of the convex lens and a concave mirror. In such a case, the convex lens can focus the light, which is emitted from the light source and transmits through the region of the substrate formed with the black matrix, onto the concave mirror, and then the concave mirror reflects the light to the preset position where the photometer 60 or the photoelectric sensor is provided.

On the other hand, the embodiment of the present disclosure also provides a post-baking method for forming a black matrix by means of the post-baking device, the post-baking method comprises: providing a housing, which defines an inner accommodation space with a plurality of heating elements provided therein; placing the substrate comprising the black matrix to be post-baked onto at least one bracket and into the inner accommodation space, post-baking the black matrix by means of the heating elements during the post-baking process, and rotating the at least one bracket with respect to the heating elements at the same time.

As an example, the at least one bracket is rotated at different rotating speeds in the post-baking period.

Moreover, the post-baking method according to the embodiment of the present disclosure further comprises: in the post-baking period, detecting the light intensity of the light transmitting through a region of the substrate formed with the black matrix; determining whether the black matrix undergoes deformation according to the variation of the light intensity so as to obtain a determined result; and outputting a driving signal to control the at least one bracket to rotate based on the determined result.

As an example, determining whether the black matrix undergoes deformation according to the variation of the light intensity so as to obtain the determined result comprises comparing the detected light intensity with a preset light intensity, for example, the light intensity when the black matrix doesn't undergo deformation, that is to say, when the black matrix has its cross sectional shape after the development process and before the post-baking process or the black matrix has its cross sectional shape in an ideal state (for example, the designed value), if the two kinds of light intensity are equal to each other, it is determined that the black matrix undergoes no deformation, otherwise, for example, the detective light intensity is less than the preset light intensity, it is determined that the black matrix suffers from collapse, thereby a determined result is obtained. Outputting the driving signal based on the determined result to control the at least one bracket to rotate comprises the following: if the determined result is that the black matrix undergoes no deformation, the rotating speed of the bracket is not changed, i.e., the rotating speed when the detection is conducted is kept unchanged, but if the determined result is that the black matrix undergoes deformation, the rotating speed of the bracket is varied so that the bracket rotates at a changed rotating speed.

As to the post-baking device and post-baking method for forming the black matrix according to the embodiments of the present disclosure, the post-baking device comprises a bracket for bearing the substrate formed with the black matrix and heating elements, and the heating elements and the bracket are rotatable with respect to each other; thus it is possible to heat the substrate evenly in the post-baking period, thereby refining the profile of the black matrix and improving the forming quality of the black matrix; and further, the bracket is rotatable in such a way that a centrifugal force can be applied to the black matrix during the post-baking process, so that the collapse caused by the gravity force can be overcome to some extents. Further, the bracket has a variable rotating speed, for example, the rotating speed can be varied by monitoring the deformation degree of the black matrix and based on the profile of the black matrix; for example, when the black matrix undergoes collapse in the post-baking period, the driving device can be used to control the bracket to rotate at an increased rotating speed, thereby the substrate formed with the black matrix also rotates at an increased speed, the material of the black matrix is subjected to an increased centripetal force so that the collapsed material moves outward to alleviate the collapse, and the magnitude of the rotating speed can also be adjusted according to the collapse situation, that is, the greater the collapse extent is, the more the rotating speed is increased, and the smaller the collapse extent is, the less the rotating speed is increased, thereby the deformation of the black matrix can be further remedied, the black matrix of a better forming quality can be obtained, the processing quality of the substrate is improved and the performance of products equipped with the substrate is accordingly improved.

The above embodiments only intend to illustrate the present disclosure, rather than limiting the present disclosure, the ordinary skilled in this art can also make various variations and modifications without departing the spirit and scope of the present disclosure, therefore, all equivalent technical solutions also belong to the domain of the present disclosure, the patentable protective scope of the present disclosure should be defined by the claims.

The present application claims the priority of the Chinese patent application No. 201510315992.1 filed on Jun. 10, 2015, the entirety of which is incorporated herein by reference as a part of the present application.

What is claimed is:

1. A post-baking device configured for forming a black matrix, comprising:
   a housing defining an inner accommodation space;
   a plurality of heating elements provided within the housing; and
   at least one bracket provided in the inner accommodation space and configured to bear a substrate formed with the black matrix,
   wherein the bracket is rotatable with respect to the plurality of heating elements, and the substrate comprises a color filter substrate or an array substrate.

2. The post-baking device according to claim 1, wherein the bracket is rotatable with a variable rotating speed, and the post-baking device further comprises a driving device configured to rotate the bracket.

3. The post-baking device according to claim 2, wherein the driving device is configured to change the rotating speed of the bracket according to variation of a shape of the black matrix.

4. The post-baking device according to claim 2, further comprising a detection device, which is configured to detect a light intensity of light transmitting through a region of the substrate in which the black matrix is formed, determine whether the black matrix undergoes deformation and output a driving signal to the driving device.

5. The post-baking device according to claim 4, wherein the detection device comprises:
   a light source emitting the light toward the region of the substrate in which the black matrix is formed; and
   a photometer, which is configured to receive the light emitted from the light source and transmitting through the region, and detect the light intensity of the light transmitting through the region.

6. The post-baking device according to claim 5, wherein the detection device further comprises:
   a processing unit, which is configured to compare the light intensity detected by the photometer with a preset light intensity, determine whether the black matrix undergoes deformation and output the driving signal.

7. The post-baking device according to claim 6, wherein the detection device further comprises a storage unit for storing the preset light intensity.

8. The post-baking device according to claim 4, wherein the detection device comprises:
   a light source emitting the light toward the region of the substrate in which the black matrix is formed; and
   a photoelectric sensor, which is configured to receive the light emitted from the light source and transmitting through the region, detect the light intensity of the light transmitting through the region, determine whether the black matrix undergoes deformation and output a driving signal.

9. The post-baking device according to claim 5, further comprising an optical system, which is provided between the substrate and the photometer, and configured to guide the light emitted by the light source and transmitting through the region toward the photometer.

10. The post-baking device according to claim 9, wherein the optical system comprises a plane mirror or a concave mirror, and the plane mirror or the concave mirror reflects the light emitted by the light source and transmitting through the region to the photometer.

11. The post-baking device according to claim 2, further comprising a rotating shaft, which is secured together with the bracket and configured to drive the bracket to rotate and be driven by the driving device.

12. The post-baking device according to claim 11, wherein a plurality of brackets are provided, each of which is equipped with one rotating shaft, or the plurality of brackets share one rotating shaft.

13. The post-baking device according to claim 1, wherein the heating elements comprise any one of a resistance heater, an infrared heater, a dielectric heater or any combination thereof.

14. The post-baking device according to claim 13, wherein a shape of the heating element is any one of a planar shape, a strip shape, a rod shape or any combination thereof.

15. A post-baking method for forming a black matrix, comprising:
   providing a housing which defines an inner accommodation space and in which a plurality of heating elements are provided;
   placing the substrate comprising the black matrix to be post-baked onto at least one bracket and into the inner accommodation space; and
   post-baking the black matrix by the heating elements during a post-baking period, and at the same time, rotating the at least one bracket with respect to the heating elements;
   wherein the at least one bracket is rotated at different rotating speeds in the post-baking period, and the method further comprises: in post-baking period,
   detecting a light intensity of light transmitting through a region of the substrate in which the black matrix is formed;
   determining whether the black matrix undergoes deformation according to variation of the light intensity so as to obtain a determined result; and
   outputting a driving signal to control the at least one bracket to rotate based on the determined result.

16. The post-baking device according to claim 8, further comprising an optical system, which is provided between the substrate and the photoelectric sensor, and configured to guide the light emitted by the light source and transmitting through the region toward the photoelectric sensor.

17. The post-baking device according to claim 9, wherein the optical system comprises a plane mirror or a concave mirror, and the plane mirror or the concave mirror reflects the light emitted by the light source and transmitting through the region to the photoelectric sensor.

18. A post-baking device configured for forming a black matrix, comprising:
   a housing defining an inner accommodation space;
   a plurality of heating elements provided within the housing; and
   at least one bracket provided in the inner accommodation space and configured to bear a substrate formed with the black matrix,
   wherein the bracket is rotatable with respect to the plurality of heating elements, the bracket is rotatable with a variable rotating speed, and
the post-baking device further comprises a driving device configured to rotate the bracket, and
the driving device is configured to change the rotating speed of the bracket according to variation of a shape of the black matrix.

\* \* \* \* \*